United States Patent [19]

Suzuki et al.

[11] Patent Number: 4,844,568
[45] Date of Patent: Jul. 4, 1989

[54] SCANNING TYPE PROJECTION EXPOSURE SYSTEM

[75] Inventors: Masaki Suzuki; Hiroyuki Nagano, both of Osaka; Takeo Sato, Kawasaki; Toshiyuki Watanabe, Osaka, all of Japan

[73] Assignee: Matsushita Electric Industrial Co., Ltd., Osaka, Japan

[21] Appl. No.: 199,078

[22] Filed: May 26, 1988

[30] Foreign Application Priority Data

May 27, 1987 [JP] Japan .................................. 62-130518
Jun. 26, 1987 [JP] Japan .................................. 62-160013

[51] Int. Cl.⁴ ............................................. G02B 26/10
[52] U.S. Cl. .................................. 350/6.2; 250/491.1
[58] Field of Search ................. 350/6.2, 6.1, 6.3, 484, 350/486; 250/491.1, 492.2; 430/5, 311, 320, 321; 378/34, 35, 146, 147, 148

[56] References Cited

U.S. PATENT DOCUMENTS 4,057,347  11/1977  Moriyama et al. ............. 250/491.1
4,514,858   4/1985  Novak .......................... 250/491.1
4,707,609  11/1987  Shimamura .................... 250/492.2

Primary Examiner—Bruce Y. Arnold
Assistant Examiner—Ronald M. Kachmarik
Attorney, Agent, or Firm—Pollock, VandeSande & Priddy

[57] ABSTRACT

A scanning type projection exposure system includes a source emitting light. The light is applied to a portion of a mask having a preset pattern. At least one optical erect projection sub-system images a portion of the pattern on a substrate. The portion of the pattern corresponds to the portion of the mask exposed to the light. The projection sub-system is subjected to scanning movement. The mask and the substrate are subjected to scanning movement. Relative positions of the mask and the substrate are held fixed during the scanning movement of the mask and the substrate.

10 Claims, 5 Drawing Sheets

SCANNING TYPE PROJECTION EXPOSURE SYSTEM

BACKGROUND OF THE INVENTION

This invention relates to a scanning type projection exposure system used in manufacture of semiconductor devices or liquid crystal devices.

General methods of manufacturing semiconductor devices or liquid crystal devices include a photolithographic process which transfers an image from a photographic mask to a resultant pattern on a wafer. Some scanning type projection exposure systems are used in such a photolithographic process. It is desirable to increase the resolution and accuracy of the exposure system.

SUMMARY OF THE INVENTION

It is an object of this invention to provide a scanning type projection exposure system having a high resolution.

It is another object of this invention to provide an accurate scanning type projection exposure system.

A scanning type projection exposure system of this invention includes a source emitting light. The light is applied to a portion of a mask having a preset pattern. At least one optical erect projection sub-system images a portion of the pattern on a substrate. The portion of the pattern corresponds to the portion of the mask exposed to the light. The projection sub-system is subjected to scanning movement. The mask and the substrate are subjected to scanning movement. Relative positions of the mask and the substrate are held fixed during the scanning movement of the mask and the substrate.

Another scanning type projection exposure system of this invention includes a source emitting light. A condenser focuses the light. At least one optical fiber cable transmits the focused light. At least one spot illumination sub-system focuses the transmitted light on a mask. The optical fiber cable and the spot illumination sub-system are rotated together in scanning movement. An optical projection sub-system applies the light, which passed through the mask, to a substrate. The mask and the substrate are subjected to scanning movement. Relative positions of the mask and the substrate are held fixed during the scanning movement of the mask and the substrate.

DESCRIPTION OF THE FIRST PREFERRED EMBODIMENT

Figure 1:
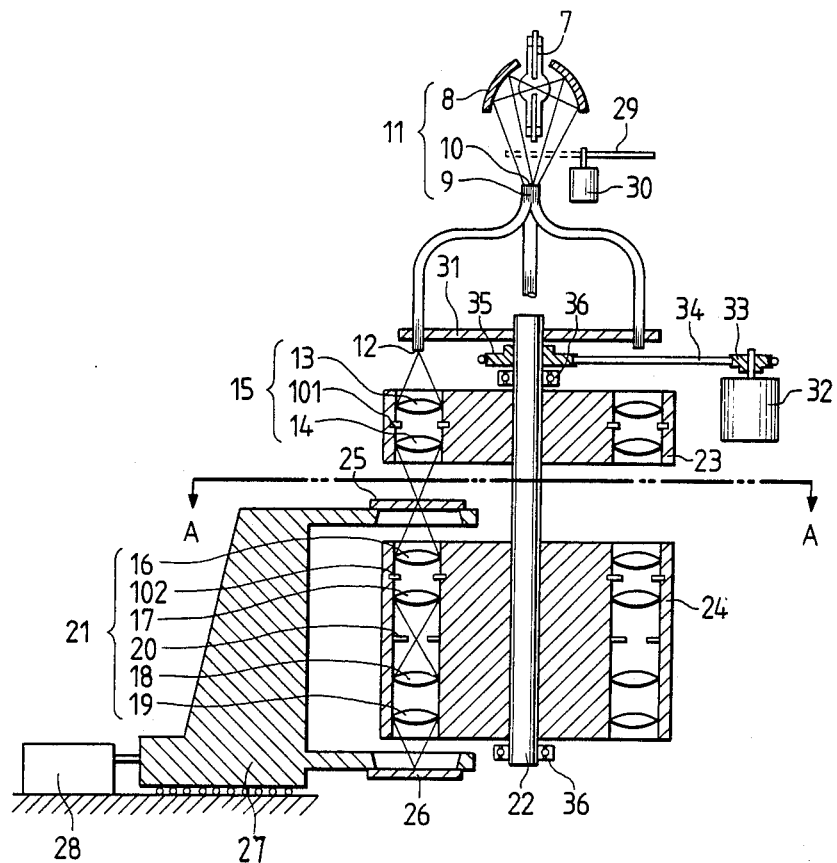
FIG. 1 is a longitudinal section view of a scanning type projection exposure system according to a first embodiment of this invention.

As shown in FIG. 1, a scanning type projection exposure system according to a first embodiment of this invention includes a light source 7 composed of a mercury-vapor lamp. A reflecting mirror 8 extending around the light source 7 is of the infrared ray transmissive type and has an ellipsoidal surface. Inlets 10 of optical fiber cables 9 extend close to each other and within a small circle. In general, each of the optical fiber cables 9 includes a bundle of optical fibers. Outlets 12 of the optical fiber cables 9 are spaced circumferentially along a large circle. A major portion of light emitted from the source 7 travels to the reflecting mirror 8, being reflected by the mirror 8 toward the inlets 10 of the optical fiber cables 9. The reflecting mirror 8 and the inlets 10 of the optical fiber cables 9 form a condenser 11. A rotatable shutter 29 driven by a motor 30 selectively enables and inhibits the travel of the light from the mirror 8 to the inlets 10 of the optical fiber cables 9.

When the light enters the inlets 10 of the optical fiber cables 9, the light is divided into portions whose number equals the number of the optical fiber cables 9. After the divided portions of the light travel through the respective optical fiber cables 9, they move from the respective outlets 12 of the optical fiber cables 9. The outlets 12 of the optical fiber cables 9 are fixed to a rotatable shaft 22 by a support 31. The optical fiber cables 9 rotate together with the shaft 22.

Spot illumination sections 15 are associated with the respective optical fiber cables 9. The outlets 12 of the optical fiber cables 9 extend on respective optical axes of the spot illumination sections 15 so that the lights move from the optical fiber cables 9 into the spot illumination sections 15. Each of the spot illumination sections 15 includes an auxiliary condenser lens 13, an aperture diaphragm 101, and a main condenser lens 14 which are supported within a bore extending through a housing 23. The housing 23 is mounted on the shaft 22 so that the housing 23 rotates together with the shaft 22. After the light moves from the outlet 12 of the optical fiber cable 9, the light passes through the lens 13, the aperture diaphragm 101, and the lens 14 and focuses on a mask 25 with a preset pattern. While the light passes through the mask 25, the light picks up information related to the mask pattern.

Erect projection sections 21 extend coaxially with the respective spot illumination sections 15. Each of the projection sections 21 includes lenses 16, 17, 18, and 19, an aperture diaphragm 102, and a field stop 20 which are supported within a bore extending through a housing 24. The housing 24 is mounted on the shaft 22 so that the housing 24 rotates together with the shaft 22. After the light passes through the mask 25, the light enters the projection section 21 and moves through the devices 16, 102, 17, 20, 18, and 19. The projection section 21 focuses the light on a semiconductor substrate or a liquid crystal substrate 26 so that the pattern in the mask 25 is imaged on the substrate 26. Accordingly, the mask pattern is optically printed on the substrate 26. Each of the projection sections 21 has a magnification of unit, that is, a magnification of 1:1.

Sets each composed of one spot illumination section 15 and the associated projection section 21 have optical axes which extend parallel to the shaft 22 and which are spaced circumferentially along a common circle.

The mask 25 and the substrate 26 are mounted on a carriage 27. The carriage 27 can be driven by a linear motor 28 in a radial direction C (see FIG. 2) with respect to the shaft 22. During movement of the carriage 27, the relative positions of the mask 25 and the substrate 26 remain unchanged.

The shaft 22 is rotatably supported on a stand (not shown) by bearings 36. A small pulley 33 is mounted on a shaft of a motor 32. A large pulley 35 is mounted on the shaft 22. A belt 34 connects the pulleys 33 and 35. The shaft 22 can be rotated by the motor 32.

Figure 2:
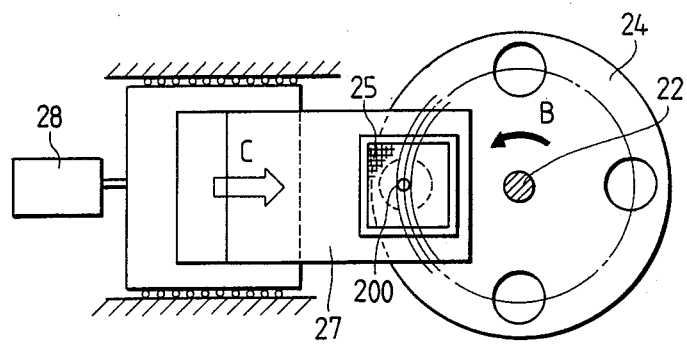
FIG. 2 is a sectional view taken along the line A—A of FIG. 1.
Figure 3:
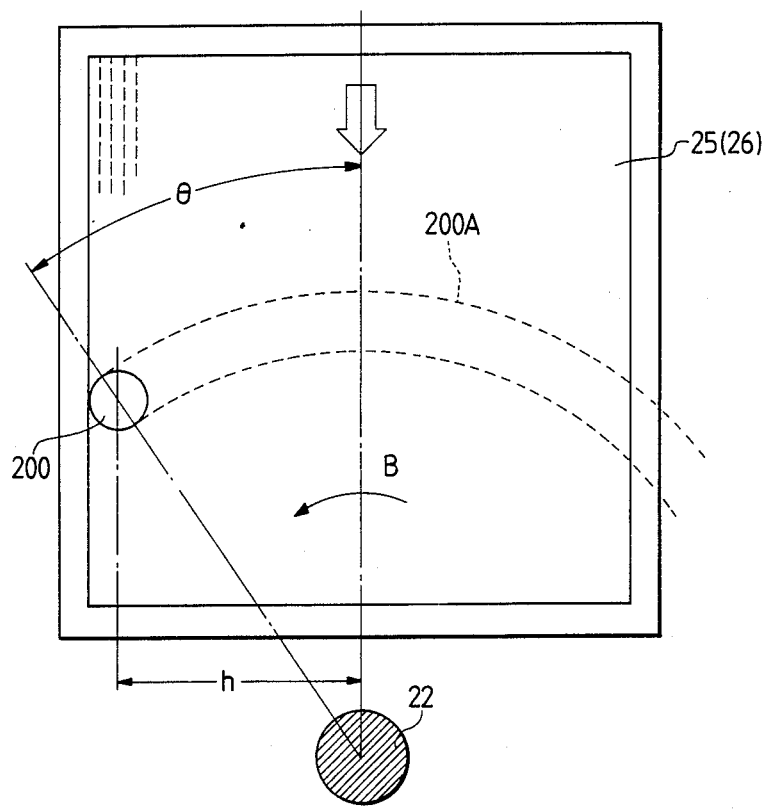
FIG. 3 is a diagram of the mask of FIGS. 1 and 2 which is scanned with an illumination spot.

As shown in FIGS. 2 and 3, the spot illumination section 15 forms an illumination spot 200 on a lower surface of the mask 25. For example, the diameter of the illumination spot 200 is 4 mm. While the light passes through the mask 25, the light picks up information related to a portion of the mask pattern which extends over an area exposed to the illumination spot 200. This portion of the mask pattern is imaged by the projection section 21 in a portion of an upper surface of the substrate 26. The shaft 22 is rotated by the motor 32 in a direction B of FIGS. 2 and 3 so that the optical fiber cables 9, the spot illumination sections 15, and the projection sections 21 rotate in the same direction B. Accordingly, during one sub-rotational scanning process, an arcuate portion 200A of the mask pattern is transferred to the substrate 26. Since there are a plurality of sets of the spot illumination section 15 and the projection section 21, two or more sub-rotational scanning processes are performed during one complete revolution of the shaft 22. For example, there are four sets, four sub-rotational scanning processes are performed during one complete revolution of the shaft 22. In addition, the mask 25 is scanned linearly along the radial direction C (see FIG. 2) in accordance with movement of the carriage 27 by the motor 28. The rotatively scanning process and the linearly scanning process allow the illumination spot 200 to closely scan the entire area of the mask 25, so that the substrate 26 is exposed to the light corresponding to the entire mask pattern.

In cases where the diameter of the illumination spot 200 is 4 mm and the speed of linearly scanning of the mask 25 is 50 mm/sec, the shaft 22 is preferably rotated at a speed of 9375 rpm. In these cases, the arcuate scanning is reiterated fifty times while the region having a width of 4 mm is scanned linearly, and an unevenness in the illumination caused by the arcuate scanning can be equal to or less than 2%.

As shown in FIG. 3, the illuminance at a point on the substrate 26, which is distant from the central line of scanning by a distance "h" and an angle $\theta$, is greater than the illuminance at the central line of scanning by a factor of $1/\cos\theta$. In view of this fact, an automatic adjustment mechanism (not shown) controls the aperture diaphragms 101 and 102, and the field stop 20 in accordance with the rotational angle $\theta$ so that the total quantity of the transmitted light varies as a function of $\cos\theta$.

Since the erect projection sections 21 have a magnification of 1:1, yaw and roll in the linear scan by the carriage 27 are prevented from causing a distortion of an exposure pattern.

Since arcuate illumination is performed by rotating an illumination spot, a high resolution is ensured in comparison with a known system in which arcuate illumination is obtained by a slit. In addition, a large percentage of the light emitted from the source 7 can be used in the exposure process.

This emdodiment may be modified as follows. The number of lenses in each of the spot illumination sections 15 may differ from two. The number of lenses in each of the projection sections 21 may differ from four. The spot illumination sections 15 and the projection sections 21 may be rotated by separate drive units, and rotation of the sections 15 and rotation of the sections 21 may be synchronized electrically. The mask 25 and the substrate 26 may be moved by separate drive units, and movement of the mask 25 and movement of the substrate 26 may be synchronized electrically. There may be a single set of the spot illumination section 15 and the projection section 21. The light from the source 7 may be distributed by mirrors to the respective spot illumination sections 15. The optical fiber cables 9 and the spot illumination sections 15 may be replaced by a condenser which focuses the light from the source 7 on an entire area of the mask 25.

DESCRIPTION OF THE SECOND PREFERRED EMBODIMENT

Figure 4:
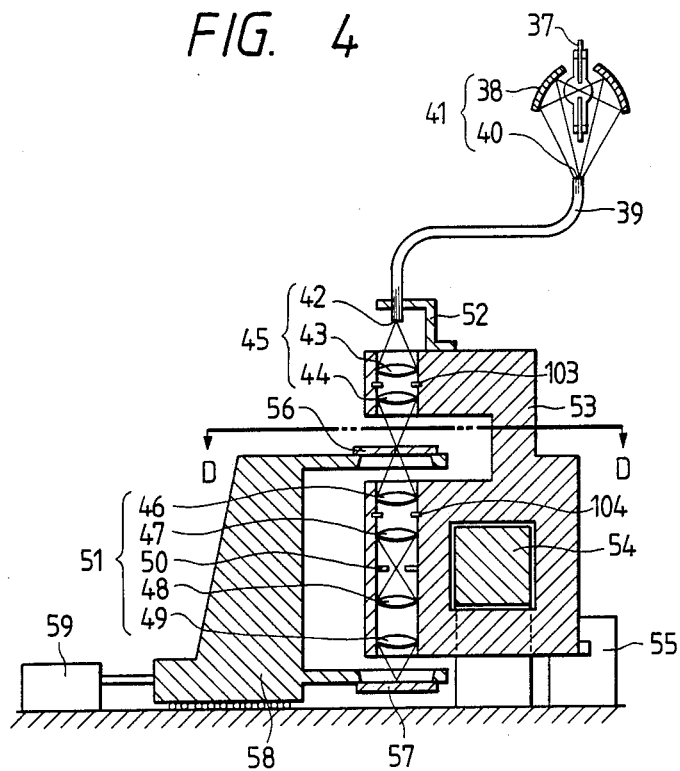
FIG. 4 is a longitudinal section view of a scanning type projection exposure system according to a second embodiment of this invention.

As shown in FIG. 4, a scanning type projection exposure system according to a second embodiment of this invention includes a light source 37 composed of a mercury-vapor lamp. A reflecting mirror 38 extending around the light source 37 is of the infrared ray transmissive type and has an ellipsoidal surface. A major portion of light emitted from the source 37 travels to the reflecting mirror 38, being reflected by the mirror 38 toward an inlet 40 of an optical fiber cable 39. The reflecting mirror 38 and the inlet 40 of the optical fiber cable 39 form a condenser 41.

After the light enters the inlet 40 of the optical fiber cable 39, the light travels through the optical fiber cable 39 and moves from an outlet 42 of the optical fiber cable 39. The outlet 42 of the optical fiber cable 39 is fixed to a movable stand 53 by a support 52. The optical fiber cable 39 moves together with the stand 53.

The outlet 42 of the optical fiber cable 39 extends on an optical axis of a spot illumination section 45 so that the light moves from the optical fiber cable 39 into the spot illumination section 45. The spot illumination section 45 includes an auxiliary condenser lens 43, an aperture diaphragm 103, and a main condenser lens 44 which are supported within a bore extending through a wall of the stand 53. The illumination section 45 moves together with the stand 53. After the light moves from the outlet 42 of the optical fiber cable 39, the light passes through the lens 43, the aperture diaphragm 103, and the lens 44 and focuses on a mask 56 with a preset pattern. While the light passes through the mask 56, the light picks up information related to the mask pattern.

An erect projection section 51 extends coaxially with the spot illumination section 45. The projection section 51 includes lenses 46, 47, 48, and 49, an aperture diaphragm 104, and a field stop 50 which are supported within a bore extending through a wall of the stand 53. The projection section 51 moves together with the stand 53. After the light passes through the mask 56, the light enters the projection section 51 and moves through the devices 46, 104, 47, 50, 48, and 49. The projection section 51 focuses the light on a semiconductor substrate or a liquid crystal substrate 57 so that he pattern in the mask 56 is imaged on the substrate 57.

Accordingly, the mask pattern is optically printed on the substrate 57. The projection section 51 has a magnification of unit, that is, a magnification of 1:1.

The mask 56 and the substrate 57 are mounted on a carriage 58. The carriage 58 can be driven by a linear motor 59 in a direction F (see FIG. 5). During movement of the carriage 58, the relative positions of the mask 56 and the substrate 57 remain unchanged.

Figure 5:
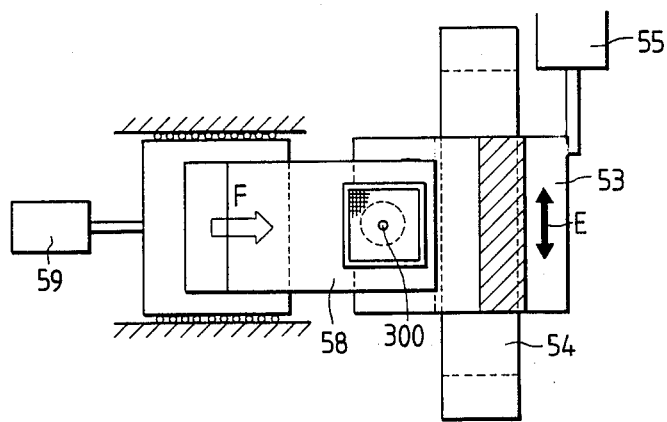
FIG. 5 is a sectional view taken along the line D—D of FIG. 4.

As shown in FIGS. 4 and 5, the stand 53 is slidably supported on a straight track or guide member 54. The stand 53 can be reciprocated by a linear motor 55 in a direction E (see FIG. 5) which extends along the track 54. The direction E is perpendicular to the direction F.

The spot illumination section 45 forms an illumination spot 300 on a lower surface of the mask 56. While the light passes through the mask 56, the light picks up information related to a portion of the mask pattern which extends over an area exposed to the illumination spot 300. This portion of the mask pattern is imaged by the projection section 51 on a portion of an upper surface of the substrate 57. The spot illumination section 45 and the projection section 51 linearly reciprocate together with the stand 53 in the direction E along the straight track 54. In addition, the mask 56 and the substrate 57 are linearly scanned by the carriage 58 in the direction F. Accordingly, the illumination spot 300 closely scans the entire area of the mask 56, so that the substrate 57 is exposed to the light corresponding to the entire mask pattern.

DESCRIPTION OF THE THIRD PREFERRED EMBODIMENT

Figure 6:
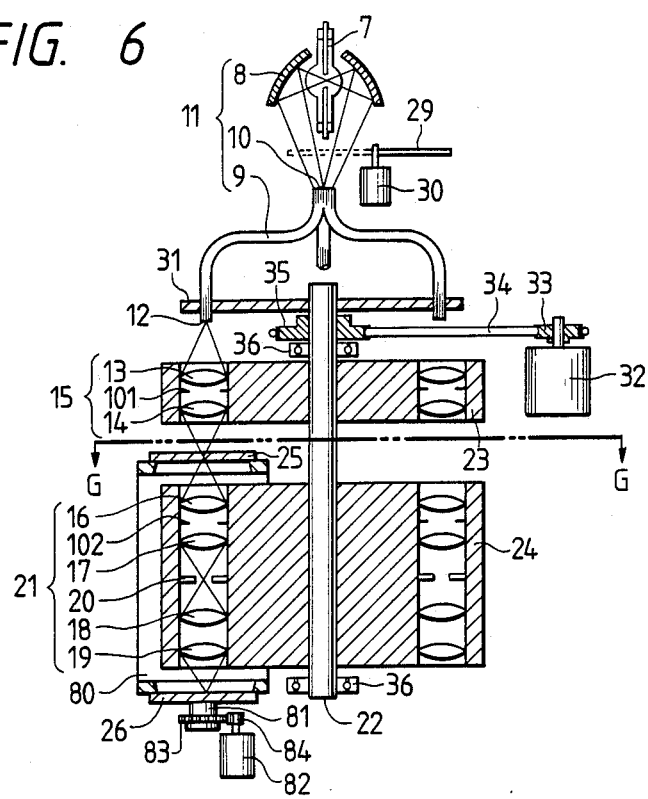
FIG. 6 is a longitudinal section view of a scanning type projection exposure system according to a third embodiment of this invention.
Figure 7:
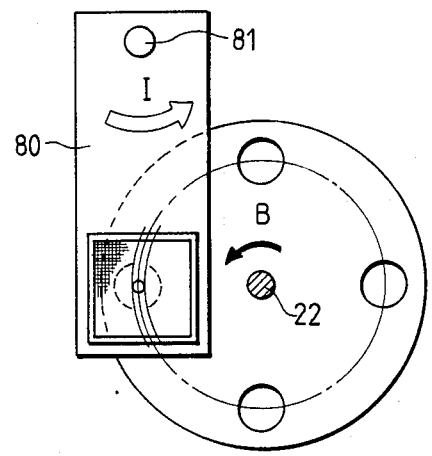
FIG. 7 is a sectional view taken along the line G—G of FIG. 6.

FIGS. 6 and 7 show a third embodiment of this invention which is similar to the embodiment of FIGS. 1-4 except for design changes described hereinafter.

A mask 25 and a substrate 26 are mounted on a carriage 80, which rotates together with a shaft 81 in a direction I (see FIG. 7). The shaft 81 is coupled to a motor 82 via a combination of gears 83 and 84, so that the shaft 81 can be rotated by the motor 82. The mask 25 and the substrate 26 is scanned along the direction I in accordance with rotation of the carriage 80. The direction of scanning of the mask 25 by the movement of the carriage 80 is approximately perpendicular to the direction of scanning of the mask 25 by the movement of a shaft 22.

DESCRIPTION OF THE FOURTH PREFERRED EMBODIMENT

Figure 8:
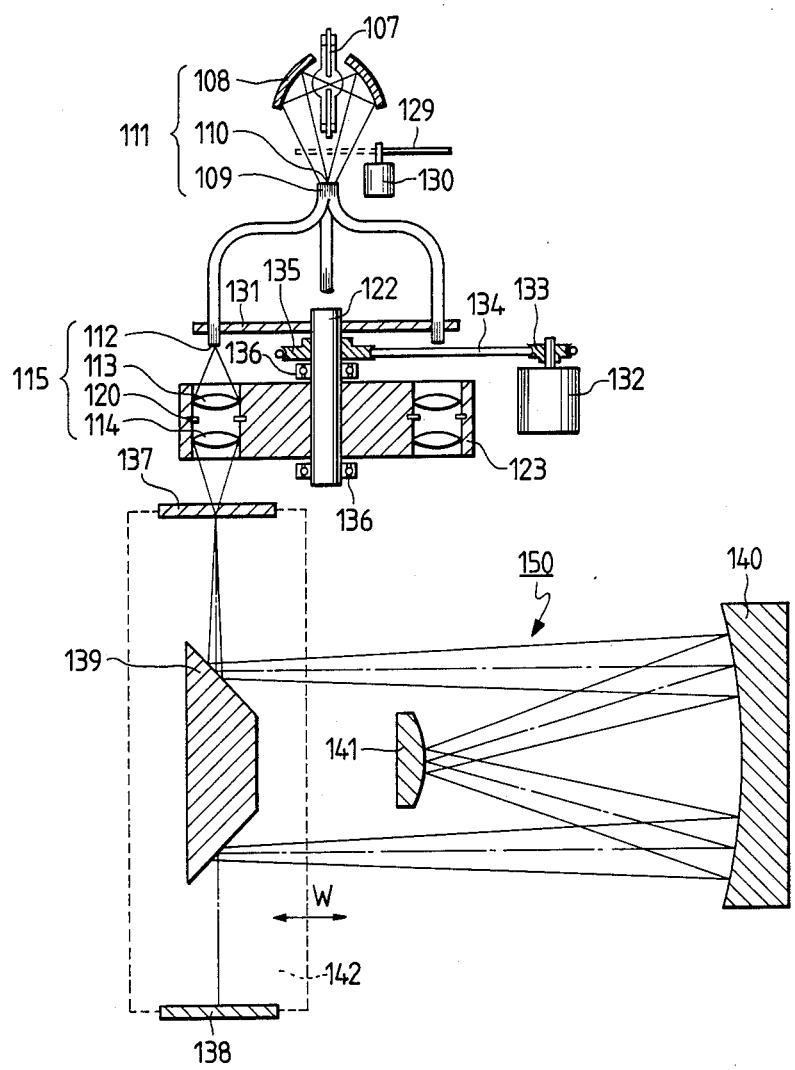
FIG. 8 is a sectional view of a scanning type projection exposure system according to a fourth embodiment of this invention.

As shown in FIG. 8, a scanning type projection exposure system according to a fourth embodiment of this invention includes a light source 107 composed of a mercury-vapor lamp. A reflecting mirror 108 extending around the light source 107 is of the infrared ray transmissive type and has an ellipsoidal surface. Inlets 110 of optical fiber cables 109 extend close to each other and within a small circle. Outlets 112 of the optical fiber cables 109 are spaced circumferentially along a large circle. A major portion of light emitted from the source 107 travels to the reflecting mirror 108, being reflected by the mirror 108 toward the inlets 110 of the optical fiber cables 109. The reflecting mirror 108 and the inlets 110 of the optical fiber cables 109 form a condenser 111. A rotatable shutter 129 driven by a motor 130 selectively enables and inhibits the travel of the light from the mirror 108 to the inlets 110 of the optical fiber cables 109.

When the light enters the inlets 110 of the optical fiber cables 109, the light is divided into portions whose number equals the number of the optical fiber cables 109. After the divided portions of the light travel through the respective optical fiber cables 109, they move from the respective outlets 112 of the optical fiber cables 109. The outlets 112 of the optical fiber cables 109 are fixed to a rotatable shaft 122 by a support 131. The optical fiber cables 109 rotate together with the shaft 122.

Spot illumination sections 115 are associated with the respective optical fiber cables 109. The outlets 112 of the optical fiber cables 109 extend on respective optical axes of the spot illumination sections 115 so that the lights move from the optical fiber cables 109 into the spot illumination sections 115. Each of the spot illumination sections 115 includes an auxiliary condenser lens 113, an aperture diaphragm 120, and a main condenser lens 114 which are supported within a bore extending through a housing 123. The housing 123 is mounted on the shaft 122 so that the housing 123 rotates together with the shaft 122. The optical axes of the spot illumination sections 115 extend parallel to the shaft 122 and are spaced circumferentially along a common circle. After the light moves from the outlet 112 of the optical fiber cable 109, the light passes through the lens 113, the aperture diaphragm 120, and the lens 114 and focuses on a mask 137 with a preset pattern. While the light passes through the mask 137, the light picks up information related to the mask pattern.

A projection section 150 includes a trapezoidal mirror 139, a concave mirror 140, and a convex mirror 141. After the light passes through the mask 137, the light enters the projection section 150. In the projection section 150, the light is reflected by a first surface of the trapezoidal mirror 139 toward the concave mirror 140 and is then reflected by the concave mirror 140 toward the convex mirror 141. The light is reflected by the convex mirror 141 toward the concave mirror 140 and is then reflected by the concave mirror 140 toward a second surface of the trapezoidal mirror 139. The light is reflected by the second surface of the trapezoidal mirror 139 and then focuses on a semiconductor substrate or a liquid crystal substrate 138. In this way, the projection section 150 focuses the light on the substrate 138 so that the pattern in the mask 137 is imaged on the substrate 138. Accordingly, the mask pattern is optically printed on the substrate 138. The projection section 150 has a magnification of unit, that is, a magnification of 1:1.

The mask 137 and the substrate 138 are mounted on a carriage 142. The carriage 142 can be driven by a linear motor (not shown) in a radial direction W with respect to the shaft 122. During movement of the carriage 142, the relative positions of the mask 137 and the substrate 138 remain unchanged.

The shaft 122 is rotatably supported on a stand (not shown) by bearings 136. A small pulley 133 is mounted on a shaft of a motor 132. A large pulley 135 is mounted on the shaft 122. A belt 134 connects the pulleys 133 and 135. The shaft 122 can be rotated by the motor 132.

The spot illumination section 115 forms an illumination spot on a lower surface of the mask 137. While the light passes through the mask 137, the light picks up information related to a portion of the mask pattern which extends over an area exposed to the illumination spot. This portion of the mask pattern is imaged by the projection section 150 in a portion of an upper surface of the substrate 138. The shaft 122 is rotated by the motor 132 so that the optical fiber cables 109 and the spot illumination sections 115 also rotate. The rotation of the illumination section 115 allows the illumination spot to scan the mask 137 in a circumferential direction with respect to the shaft 122. During one sub-rotational scanning process, an arcuate portion of the mask pattern is transferred to the substrate 138. Since there are a plurality of the spot illumination sections 115, two or more sub-rotational scanning processes are performed during one complete revolution of the shaft 122. In addition, the mask 137 is scanned linearly along the radial direction W in accordance with movement of the carriage 142. The rotatively scanning process and the linearly scanning process allow the illumination spot to closely scan the entire area of the mask 137, so that the substrate 138 is exposed to the light corresponding to the entire mask pattern.

Since arcuate illumination is performed by rotating an illumination spot, a high resolution is ensured in comparison with a known system in which arcuate illumination is obtained by a slit. In addition, a large percentage of the light emitted from the source 107 can be used in the exposure process.

What is claimed is:

1. A scanning type projection exposure system comprising:
   (a) a source emitting light;
   (b) means for applying the light to a portion of a mask having a preset pattern;
   (c) at least one optical erect projection sub-system imaging a portion of the pattern on a substrate, wherein said portion of the pattern corresponds to the portion of the mask exposed to the light;
   (d) first scanning means for producing scanning movement of the projection sub-system;
   (e) second scanning means for producing scanning movement of the mask and the substrate; and
   (f) means for holding relative positions of the mask and the substrate fixed during the scanning movement of the mask and the substrate.

2. The system of claim 1 wherein the light applying means comprises at least one spot illumination sub-system forming an illumination spot at a point near an optical axis of the projection sub-system.

3. The system of claim 1 wherein the light applying means comprises a condenser focusing the light, an optical fiber cable transmitting the focused light, and a spot illumination sub-system focusing the transmitted light on the mask.

4. The system of claim 1 wherein the first scanning means comprises means for rotating the projection sub-system.

5. The system of claim 1 wherein the first scanning means comprises means for linearly moving the projection sub-system.

6. The system of claim 1 wherein the second scanning means comprises means for rotating the mask and the substrate.

7. The system of claim 1 wherein the second scanning means comprises means for linearly moving the mask and the substrate.

8. A scanning type projection exposure system comprising:
   (a) a source emitting light;
   (b) a condenser focusing the light;
   (c) at least one optical fiber cable transmitting the focused light;
   (d) at least one spot illumination sub-system focusing the transmitted light on a mask;
   (e) means for rotating the optical fiber cable and the spot illumination sub-system together in scanning movement;
   (f) an optical projection sub-system applying the light, which passed through the mask, to a substrate;
   (g) means for producing scanning movement of the mask and the substrate; and
   (h) means for holding relative positions of the mask and the substrate fixed during the scanning movement of the mask and the substrate.

9. The system of claim 8 wherein the projection sub-system comprises a trapezoidal mirror, a concave mirror, and a convex mirror connected optically.

10. A scanning type projection exposure system comprising:
   (a) means for concentrating light on a portion of a mask and thereby forming an illumination spot at said portion of the mask, the mask having a preset pattern;
   (b) means for focusing the light, which passed through the mask, on a portion of a substrate and thereby imaging a portion of the mask pattern in said portion of the substrate, wherein said portion of the mask pattern corresponds to said portion of the mask exposed to the illumination spot;
   (c) means for moving the illumination spot relative to the mask and thereby scanning the mask with the illumination spot along a first direction; and
   (d) means for moving the illumination spot relative to the mask and thereby scanning the mask with the illumination spot along a second direction different from the first direction.

* * * * *